(12) United States Patent  
Hofmann et al.

(10) Patent No.: US 7,719,059 B2
(45) Date of Patent: May 18, 2010

(54) FIN FIELD EFFECT TRANSISTOR ARRANGEMENT AND METHOD FOR PRODUCING A FIN FIELD EFFECT TRANSISTOR ARRANGEMENT

(75) Inventors: Franz Hofmann, Munich (DE); Erhard Landgraf, Munich (DE); Richard Johannes Luyken, Munich (DE)

(73) Assignee: Infineon Technologies AG, Munich (DE)

( * ) Notice: Subject to any disclaimer, the term of this patent is extended or adjusted under 35 U.S.C. 154(b) by 154 days.

(21) Appl. No.: 11/588,868

(22) Filed: Oct. 27, 2006

(65) Prior Publication Data

US 2007/0096196 A1    May 3, 2007

Related U.S. Application Data

(63) Continuation of application No. PCT/DE2005/000746, filed on Apr. 22, 2005.

(30) Foreign Application Priority Data

Apr. 27, 2004  (DE)  ........................ 10 2004 020 593

(51) Int. Cl.
  *H01L 21/84*  (2006.01)
  *H01L 21/8238*  (2006.01)
  *H01L 27/12*  (2006.01)
(52) U.S. Cl. .................... 257/351; 257/347; 257/350; 257/369; 257/E21.442; 438/164; 438/199
(58) Field of Classification Search ................ 438/164, 438/165, 199, 283; 257/327, 347, 348, 349, 257/350, 351, 369, E21.442
See application file for complete search history.

(56) References Cited

U.S. PATENT DOCUMENTS 4,996,574 A    2/1991    Shirasaki (Continued)

FOREIGN PATENT DOCUMENTS

JP    59132646    7/1984

(Continued)

OTHER PUBLICATIONS

Anil, K. G., et al., "Layout Density Analysis of FinFETs," 2003, pp. 139-142, 0-7803-7999-3 IEEE.

(Continued)

*Primary Examiner*—Zandra Smith
*Assistant Examiner*—Eric Ward
(74) *Attorney, Agent, or Firm*—Slater & Matsil, L.L.P.

(57) ABSTRACT

A fin field effect transistor arrangement comprises a substrate and a first fin field effect transistor on and/or in the substrate. The first fin field effect transistor includes a fin in which a channel region is formed between a first source/drain region and a second source/drain region and above which a gate region is formed. A second fin field effect transistor is provided on and/or in the substrate including a fin in which a channel region is formed between a first source/drain region and a second source/drain region and above which a gate region is formed. The second fin field effect transistor is arranged laterally alongside the first fin field effect transistor, wherein a height of the fin of the first fin field effect transistor is greater than a height of the fin of the second fin field effect transistor.

17 Claims, 6 Drawing Sheets

U.S. PATENT DOCUMENTS

| | | | |
|---|---|---|---|
| 5,646,058 | A | 7/1997 | Taur et al. |
| 6,413,802 | B1 | 7/2002 | Hu et al. |
| 6,909,147 | B2 * | 6/2005 | Aller et al. ............... 257/347 |
| 7,196,380 | B2 * | 3/2007 | Anderson et al. ........... 257/369 |
| 7,224,029 | B2 * | 5/2007 | Anderson et al. ........... 257/347 |
| 7,456,055 | B2 * | 11/2008 | Orlowski et al. ............ 438/157 |
| 7,612,405 | B2 * | 11/2009 | Yu et al. ................... 257/328 |
| 7,638,843 | B2 * | 12/2009 | Xiong et al. ................ 257/347 |
| 2004/0023506 | A1 | 2/2004 | Pradeep et al. |
| 2004/0099885 | A1 * | 5/2004 | Yeo et al. ................... 257/208 |
| 2005/0167750 | A1 * | 8/2005 | Yang et al. ................. 257/347 |
| 2005/0239242 | A1 * | 10/2005 | Zhu et al. .................. 438/199 |
| 2007/0099353 | A1 * | 5/2007 | Thean et al. ................ 438/149 |
| 2007/0161171 | A1 * | 7/2007 | Burnett et al. .............. 438/197 |
| 2008/0096334 | A1 * | 4/2008 | Kobayashi .................. 438/157 |
| 2008/0128797 | A1 * | 6/2008 | Dyer et al. ................. 257/328 |

FOREIGN PATENT DOCUMENTS

WO     WO-03-088310     10/2003

OTHER PUBLICATIONS

Decision, The Intellectual Property Tribunal, 10$^{th}$ Division, Case No. 2008 WON 7052, Mar. 31, 2009.

* cited by examiner

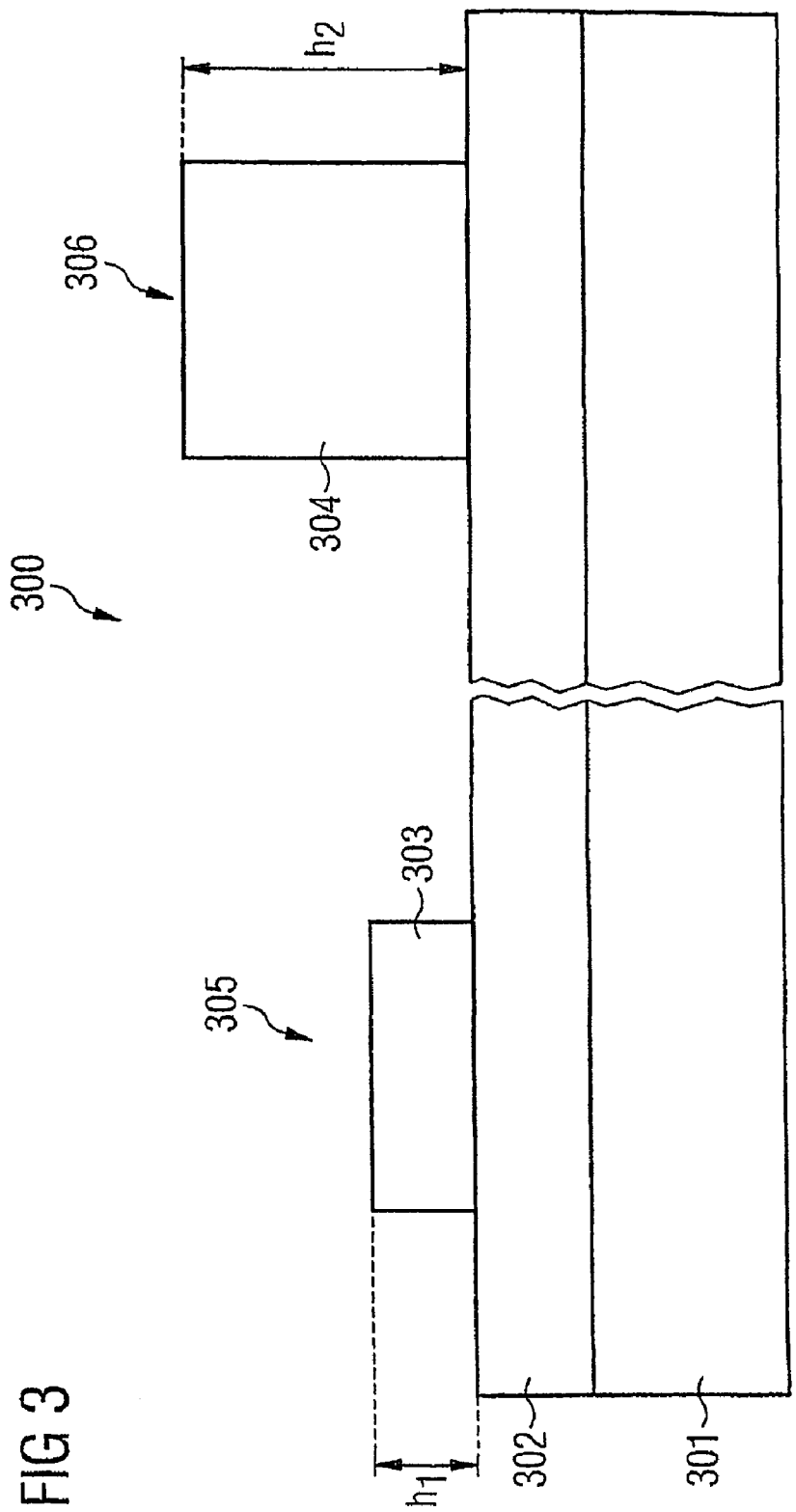

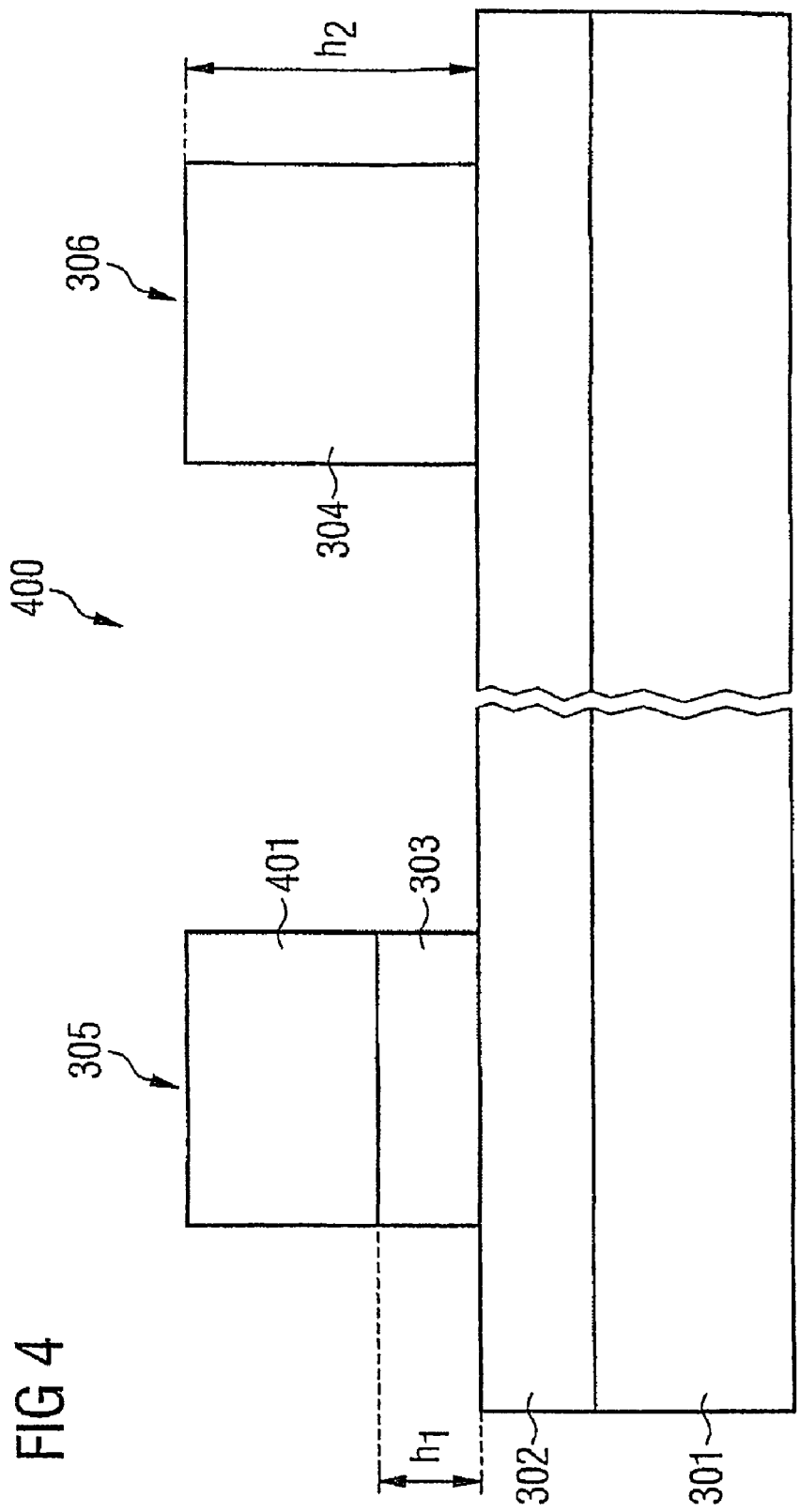

FIN FIELD EFFECT TRANSISTOR ARRANGEMENT AND METHOD FOR PRODUCING A FIN FIELD EFFECT TRANSISTOR ARRANGEMENT

This application is a continuation of co-pending International Application No. PCT/DE2005/000746, filed Apr. 22, 2005, which designated the United States and was not published in English, and which is based on German Application No. 10 2004 020 593.0 filed Apr. 27, 2004, both of which applications are incorporated herein by reference.

TECHNICAL FIELD

The invention relates to a fin field effect transistor arrangement and a method for producing a fin field effect transistor arrangement.

BACKGROUND

In CMOS technology, circuits are formed that are integrated on a substrate, the circuits having n-channel field effect transistors and p-channel field effect transistors. When the transistors of different conduction types are dimensioned identically, it happens that an n-channel transistor of a CMOS circuit has a different current driver capability than a p-channel transistor of the circuit.

In the case of integrated circuit components in CMOS technology that have n-MOS transistors and p-MOS transistors (for example inverters, oscillators, etc.), the different current driver capability of the transistors of different conduction types is compensated for in accordance with the prior art by providing p-MOS transistors having a different transistor width than n-MOS transistors. A p-channel transistor having a larger (e.g., double to triple) width than the corresponding n-channel transistor is often provided.

However, increasing the transistor width of the p-channel transistor in a CMOS circuit has the disadvantage that this enlarges the area requirement for realizing the circuit on a silicon chip. Valuable silicon area is lost as a result, which is disadvantageous in view of the cost pressure in semiconductor technology.

A description is given below, referring to FIG. 1A, FIG. 1B, of an n-MOS field effect transistor 100 and a p-MOS field effect transistor 110 of a CMOS circuit in accordance with the prior art.

The n-MOS field effect transistor 100 from FIG. 1A contains a first source/drain region 101 and a second source/drain region 102, between which a channel region 103 is formed. The electrical conductivity of the channel region 103 can be controlled by means of applying an electrical voltage to a gate region 104. The transistor width of the n-MOS field effect transistor 100 is designated by $d_1$ in FIG. 1A.

FIG. 1B shows a p-MOS field effect transistor 110, which is intended to have the same current driver capability as the n-MOS field effect transistor 100. The p-MOS field effect transistor 110 likewise has a first source/drain region 111 and a second source/drain region 112, between which a channel region 113 is formed. The electrical conductivity of the channel region 113 can be controlled by means of applying an electrical signal to a gate region 114.

As shown in FIG. 1B, the transistor width $d_2$ of the p-MOS field effect transistor 110 is significantly greater than the transistor width $d_1$ of the n-MOS field effect transistor 100.

The different transistor widths $d_1$, $d_2$ are necessary in order to achieve identical current driver capabilities of the transistors in a CMOS arrangement in which the n-MOS field effect transistor 100 and the p-MOS field effect transistor 110 are integrated. Consequently, the p-MOS field effect transistor 110 requires approximately triple the area of the n-MOS field effect transistor 100 in order to achieve the same current driver capability in both transistors 100, 110. This is disadvantageous since the necessary chip area for forming the transistors 100, 110 is thereby enlarged.

In view of the demand for increasingly smaller integrated components and transistors, which enable good control of the electrical conductivity of the channel region even with continued scaling, alternatives to conventional field effect transistors are the subject of current research and development. One such novel type of field effect transistor is the so-called fin field effect transistor. In the case of a fin field effect transistor, in a thin fin, that is to say in a thin semiconductor fin having a width of, for example, 50 nm or less, two end sections are formed as source/drain regions, a channel region being formed between the two source/drain regions in the fin. The channel region is covered by a gate insulating layer. A gate electrode is formed on the gate insulating layer, that is to say above the fin, and enables lateral driving of the electrical conductivity of the fin.

However, even in fin field effect transistors the problem arises that p-fin field effect transistors have current driver capabilities or generally transistor properties which differ from the current driver capabilities or transistor properties of an n-fin field effect transistor given identical dimensioning.

Anil, K G, et al. (2003) "Layout Density Analysis of FinFETs," ESSDERC 2003, 16.-18.09.2003 Estoril, Portugal, discloses a fin field effect transistor arrangement in which the fins of an n-MOS fin field effect transistor and the fin of a p-MOS fin field effect transistor are divided into a plurality of semiconductor partial fins formed alongside one another, it being possible for the current driver capability of the two transistors to be coordinated with one another by virtue of a different number of partial fins in the n-MOS fin field effect transistor and in the p-MOS fin field effect transistor. However, this concept has the disadvantage that the space requirement of the transistor arrangement is increased by means of dividing the fin into a plurality of partial fins, which counteracts the endeavor to increase the integration density.

A description is given below, referring to FIG. 1C, of an n-MOS fin field effect transistor 120 and, referring to FIG. 1D, of a p-MOS fin field effect transistor 130 in accordance with the prior art in which similar current driver capabilities are sought by providing in each case a plurality of partial fins that differ in their number.

The n-MOS fin field effect transistor 120 contains two silicon partial fins 125, 126. One end section of the silicon partial fins 125, 126 of the n-MOS fin field effect transistor 120, which are arranged parallel to one another, forms a first source/drain region 121, and another end section of the silicon partial fins 125, 126 of the n-MOS fin field effect transistor 120, which are parallel to one another, forms a second source/drain region 122. A channel region 123 is formed between the first source/drain region 121 and the second source/drain region 122, and the conductivity of the channel region can be controlled by a gate region 124 formed on the silicon partial fins 125, 126. A gate insulating layer (not shown) is arranged between the gate region 124 and the silicon partial fins.

The p-MOS fin field effect transistor 130 contains six silicon partial fins 135. One end section of the silicon partial fins 135 of the p-MOS fin field effect transistor 130, which are parallel to one another, forms a first source/drain region 131, and another end section of the silicon partial fins 135 of the n-MOS fin field effect transistor 130, which are arranged parallel to one another, forms a second source/drain region 132. A channel region 133 is formed between the first source/drain region 131 and the second source/drain region 132, and the electrical conductivity of the channel region can be controlled by a gate region 134 formed on the silicon partial fins 135. A gate insulating layer (not shown) is arranged between the gate region 134 and the silicon partial fins 135.

As emerges from FIG. 1C, FIG. 1D, the area requirement of a field effect transistor having a plurality of partial fins is all the greater, the larger the number of partial fins. Consequently, the provision of a plurality of partial fins considerably increases the area requirement.

Furthermore, U.S. Pat. No. 6,413,802 (the '802 Patent) describes a fin field effect transistor device, in which case, in accordance with one embodiment described therein, a plurality of field effect transistors are provided, which are stacked one above another and are insulated from one another by a dielectric layer in each case. For this stack of transistors, the '802 Patent furthermore describes that the ratio of the widths of the NMOS field effect transistors and PMOS field effect transistors can be adapted by means of adapting the thicknesses of the semiconductor layers.

U.S. patent application Publication No. 2004/0023506 discloses a method for producing a gate oxide layer with two regions having a different layer thickness.

U.S. Pat. No. 4,996,574 describes a MIS field effect transistor whose channel region is significantly smaller than double the maximum propagation of the depletion region that can form in the channel region.

SUMMARY OF THE INVENTION

The invention is based on the problem, in particular, of providing a fin field effect transistor arrangement in which the current driver capability of different fin field effect transistors can be coordinated with one another with a moderate outlay in respect of area.

The problem is solved by means of a fin field effect transistor arrangement and by means of a method for producing a fin field effect transistor arrangement comprising the features in accordance with the independent patent claims.

The fin field effect transistor arrangement according to the invention contains a substrate and a first fin field effect transistor on and/or in the substrate that has a fin in which the channel region is formed between the first and the second source/drain region and above which the gate region is formed. Furthermore, the fin field effect transistor arrangement contains a second fin field effect transistor on and/or in the substrate that has a fin in which the channel region is formed between the first and the second source/drain region and above which the gate region is formed, the second fin field effect transistor being arranged, for example, laterally alongside the first fin field effect transistor. The height of the fin of the first fin field effect transistor is greater than the height of the fin of the second fin field effect transistor.

In the method according to the invention for producing a fin field effect transistor arrangement, a first fin field effect transistor is formed on and/or in a substrate and is formed with a fin in which the channel region is formed between the first and the second source/drain region and above which the channel region is formed. Furthermore, a second fin field effect transistor is formed on and/or in the substrate and is formed with a fin in which the channel region is formed between the first and the second source/drain region and above which the gate region is formed. The height of the fin of the first fin field effect transistor is provided such that it is greater than the height of the fin of the second fin field effect transistor.

A basic idea of the invention can be seen in the recognition and utilization of the fact that in fin field effect transistors, the current flows at the sidewalls of the fin, and that a different current driver capability or generally different transistor properties of different fin field effect transistors can, therefore, be compensated for by means of adjusting the height of the fins of different fin field effect transistors of a fin field effect transistor arrangement. To put it another way, the height of a fin can be used as a process-technologically simply accessible parameter for setting the electrical properties of a fin field effect transistor with little process-technological outlay or for coordinating them with the electrical properties of another fin field effect transistor.

The fin is preferably formed from semiconductor material (e.g., from silicon), but may also be formed from metallic material.

In contrast to the prior art, in which the current driver capability of transistors of a CMOS circuit is set by means of setting the width of the transistors or solely by means of setting the number of fins of a fin field effect transistor, the setting of the current driver capability in the case of the fin field effect transistor arrangement according to the invention by means of adjusting the height of the fins does not lead to an increase in the chip area, since this increase has an effect only in a dimension perpendicular to the chip surface, but not in the surface plane of the substrate. Therefore, the fin field effect transistor arrangement according to the invention is well suited to continued scaling. Furthermore, the invention obviates the need to increase the current driver capability of a p-channel fin field effect transistor by increasing the number of fins per transistor, whereby the necessary chip surface area would in turn be increased.

The fin height of different fin field effect transistors of a fin field effect transistor arrangement is used according to the invention as a parameter for adjusting the transistor properties (threshold voltages, current driver capability, etc.) and adapting them to the requirements of a desired application.

In particular, for a CMOS fin field effect transistor arrangement, the height of the fins of the n-channel fin field effect transistors and of the p-channel fin field effect transistors can be set differently, so that both types of transistors have the same current driver capability. Consequently, by means of setting the fin height, the same current driver capability as can be produced for an n-channel fin field effect transistor can be produced for the p-channel fin field effect transistor.

Preferred developments of the invention emerge from the dependent claims.

In the case of the fin field effect transistor arrangement, the fin of the first fin field effect transistor may have doping material of the p conduction type (e.g., arsenic, phosphorus) and the fin of the second fin field effect transistor may either have doping material of the n conduction type (e.g., aluminum, boron) or be free of doping material (or have only small quantities of intrinsic doping). It is not necessary, therefore, for the channel regions of both fin field effect transistors of the fin field effect transistor arrangement to be doped, rather the advantageous effects of the invention can be achieved even when one of the channel regions is doped and the other is either doped with doping atoms of the opposite conduction type or undoped.

Therefore, in the case of the fin field effect transistor arrangement, the fin of the first fin field effect transistor may either have doping material of the p conduction type or be free of doping material and the fin of the second fin field effect transistor may have doping material of the n conduction type.

To express it more generally, the two fin field effect transistors may have different conduction types, in which case the resultant different transistor properties (primarily current driver capabilities) can be compensated for by means of setting different fin heights.

The fin field effect transistor arrangement of the invention may be set up as a CMOS arrangement, that is to say as an arrangement comprising n-channel fin field effect transistors and p-channel fin field effect transistors, it being possible for the current driver capabilities and other transistor properties to be coordinated with one another by means of adjusting the height of the fin of the two types of transistor. For this purpose, the height of the fin field effect transistor of the p conduction type is generally chosen to be higher than that of the n-fin field effect transistor.

The height of the fin of the first fin field effect transistor and the height of the fin of the second fin field effect transistor may be adjusted in such a way that the current driver capability of the first fin field effect transistor is substantially equal to the current driver capability of the second fin field effect transistor. An integrated circuit obtained in this way has a good quality and reproducible properties.

The substrate may be an SOI substrate (silicon-on-insulator). In this case, the fins may be formed in the upper silicon layer of such an SOI substrate. Since the fin height in this case is determined by the thickness of the SOI substrate, in particular of the upper silicon layer of an SOI substrate, an SOI substrate that has different top silicon thicknesses is advantageous.

The fin of the first fin field effect transistor and/or the fin of the second fin field effect transistor is or are preferably at least partly formed on or in the upper silicon layer of the SOI substrate.

In the case of the fin field effect transistor arrangement of the invention, the fin of the first fin field effect transistor and/or the fin of the second fin field effect transistor may be divided into a plurality of semiconductor partial fins formed alongside one another. As a result, the current driver capability of the transistor can be set through the combination of two measures, namely by means of setting different fin heights and by means of providing the fin as an arrangement of a plurality of semiconductor partial fins. The realization of a fin as a plurality of partial fins is described in the Anil paper described in the Background. The plurality of semiconductor partial fins may be provided between two common source/drain terminals of the fin field effect transistor and be arranged substantially parallel to one another. Consequently, it is possible to set a desired current driver capability of a transistor by means of a compensation suitable for an application being effected between the number of partial fins (the fewer there are, the smaller the area requirement) and the height of the partial fins (the smaller the height, the smaller the topology).

In the case of the fin field effect transistor arrangement in accordance with this configuration, the height of the fin of the first fin field effect transistor and the height of the fin of the second fin field effect transistor and the number of partial fins of the first fin field effect transistor and the number of partial fins of the second fin field effect transistor may be adjusted in such a way that the current driver capability of the first fin field effect transistor is substantially equal to the current driver capability of the second fin field effect transistor. In other words, a desired current driver capability or other transistor property is set by using the fin height and the number of fins as adjustment parameters. Preferably, at least one in the fin field effect transistor arrangement has at least two partial fins.

The method according to the invention for producing a fin field effect transistor arrangement is described below. Configurations of the fin field effect transistor arrangement also apply to the method for producing a fin field effect transistor arrangement, and vice versa.

In particular, configurations enabling the realization of fins having different heights in the fin field effect transistors are described below.

In accordance with one configuration, an electrically insulating layer may be formed for this purpose between the substrate and the fin of the second fin field effect transistor. The thickness of the electrically insulating layer may be provided, e.g., such that the thickness together with the height of the fin of the second fin field effect transistor is substantially equal to the height of the fin of the first fin field effect transistor. It is thereby possible to compensate for the different topologies on account of the different heights of the fin of the first and of the second fin field effect transistor, which may be advantageous for subsequent processing.

As an alternative to the configuration described, an electrically insulating layer may be formed on the fin of the second fin field effect transistor. In this case, the fin of the second fin field effect transistor is formed, e.g., directly on the substrate and an electrically insulating layer is deposited above it. It is thereby possible, using the electrically insulating layer as a spacer or as a height compensation structure, to compensate for the different heights of the fin of the first and of the second fin field effect transistors, and thereby to obtain a layer arrangement having a more uniform topology. In particular, the thickness of the electrically insulating layer, in accordance with the configurations described, may be adjusted in such a way that the electrically insulating layer together with the fin of the second fin field effect transistor has a height that is substantially equal to the height of the fin of the first fin field effect transistor.

In accordance with an alternative configuration, the fin of the first fin field effect transistor and the fin of the second fin field effect transistor may be formed by forming and patterning a common semiconductor layer on the substrate, so that a first laterally delimited layer forming the fin of the first fin field effect transistor is formed and a second laterally delimited layer is formed. The fin of the second fin field effect transistor may then be formed by removing material of the second laterally delimited layer. To put it in another way, in order to form the fin of the second fin field effect transistor, semiconductor material is removed from the second laterally delimited layer (for example, removed by means of etching, in which case the fin of the first fin field effect transistor should then be protected against etching by being covered with an auxiliary structure), whereby the height of the fin of the second fin field effect transistor is reduced relative to the height of the fin of the first fin field effect transistor.

In accordance with another alternative method, the fin of the first fin field effect transistor and the fin of the second fin field effect transistor are formed from a surface semiconductor layer of a planar substrate, which surface semiconductor layer has a larger thickness in the region of the first fin field effect transistor than in the region of the second fin field effect transistor. The layer sequence known from PCT Application Publication No. WO 03/088310 A2 (the '310 publication), in particular from FIG. 6 of the '310 publication, may be used as an initial substrate for this purpose. Accordingly, an insulator layer having a stepped surface is provided, a semiconductor layer having different thicknesses being provided on the stepped surface. By forming the first fin field effect transistor (the one having the higher fin) in a semiconductor region of the substrate in accordance with the '310 publication in which the semiconductor layer has a larger thickness, and by forming the fin of the second fin field effect transistor (the one with the lower fin) in a region of the substrate in which the semiconductor layer has a smaller thickness, it is possible to fabricate a fin field effect transistor arrangement which has a small surface topology.

An SOI substrate (silicon-on-insulator) may be used as substrate, which, in particular, may be partly or fully depleted of charge carriers and/or may be a thin-film SOI substrate.

The fin of the first fin field effect transistor and/or the fin of the second fin field effect transistor may be at least partly formed from the upper silicon layer of the SOI substrate.

Doping material may be introduced into the fin of the first fin field effect transistor and/or into the fin of the second fin field effect transistor. In each of the fin field effect transistors, the doping material may be doping material of the p conduction type (for example, arsenic or phosphorus) or of the n conduction type (for example, aluminum or boron). As a result, it is possible to create a CMOS arrangement or some other circuit arrangement that contains both p-channel transistors and n-channel transistors having transistor properties that can be adapted to one another.

The doping material may be introduced in particular using the plasma immersion ion implantation method, the rapid vapor phase doping method or the solid phase diffusion method. These methods are particularly suitable as doping methods for doping fins, in particular fins having a large height.

BRIEF DESCRIPTION OF THE DRAWINGS

Exemplary embodiments of the invention are illustrated in the figures and are explained in more detail below. In the figures:

FIG. 3 shows a cross-sectional view of a fin field effect transistor arrangement in accordance with one exemplary embodiment of the invention;

FIG. 4 shows a cross-sectional view of a fin field effect transistor arrangement in accordance with another exemplary embodiment of the invention.

Figure 1A:
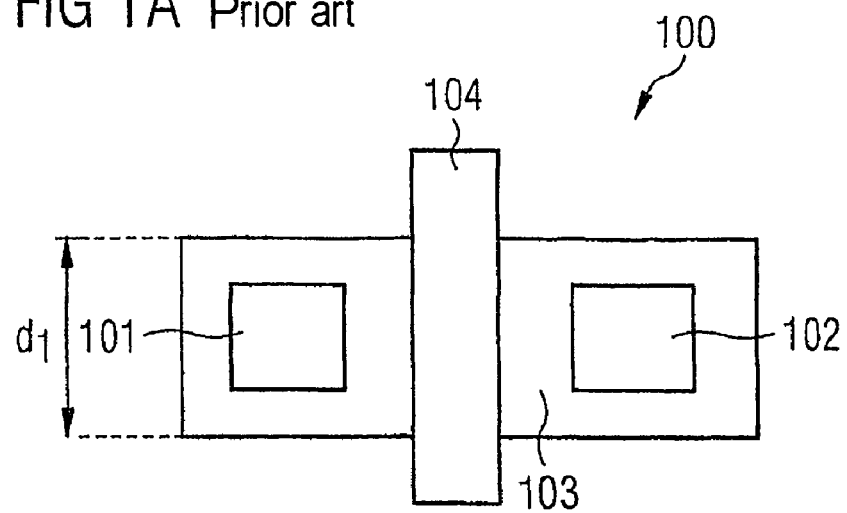
FIGS. 1A and 1B show plan views of an n-MOS transistor and a p-MOS transistor in accordance with the prior art.

The following list of reference symbols can be used in conjunction with the figures:
100 n-MOS field effect transistor
101 First source/drain region
102 Second source/drain region
103 Channel region
104 Gate region
110 p-MOS field effect transistor
111 First source/drain region
112 Second source/drain region
113 Channel region
114 Gate region
120 n-MOS fin field effect transistor
121 First source/drain region
122 Second source/drain region
123 Channel region
124 Gate region
125 First silicon partial fin
126 First silicon partial fin
130 p-MOS fin field effect transistor
131 First source/drain region
132 Second source/drain region
133 Channel region
134 Gate region
135 Silicon partial fins
200 n-MOS fin field effect transistor
201 First source/drain region
202 Second source/drain region
210 p-MOS fin field effect transistor
211 First source/drain region
212 Second source/drain region
220 Silicon substrate
221 Silicon oxide layer
300 Fin field effect transistor arrangement
301 Silicon substrate
302 Silicon oxide layer
303 First silicon fin
304 Second silicon fin
305 n-MOS fin field effect transistor region
306 p-MOS fin field effect transistor region
400 Fin field effect transistor arrangement
401 Silicon oxide structure
500 Fin field effect transistor arrangement
501 Additional silicon oxide layer

DETAILED DESCRIPTION OF ILLUSTRATIVE EMBODIMENTS

Identical or similar components in different figures are provided with identical reference numerals.

The illustrations in the figures are schematic and not to scale.

A description is given below, referring to FIG. 2A, FIG. 2B, of an n-MOS fin field effect transistor 200 and a p-MOS fin field effect transistor 210, which are integrated in a fin field effect transistor arrangement according to the invention and in a common substrate.

Figure 2A:
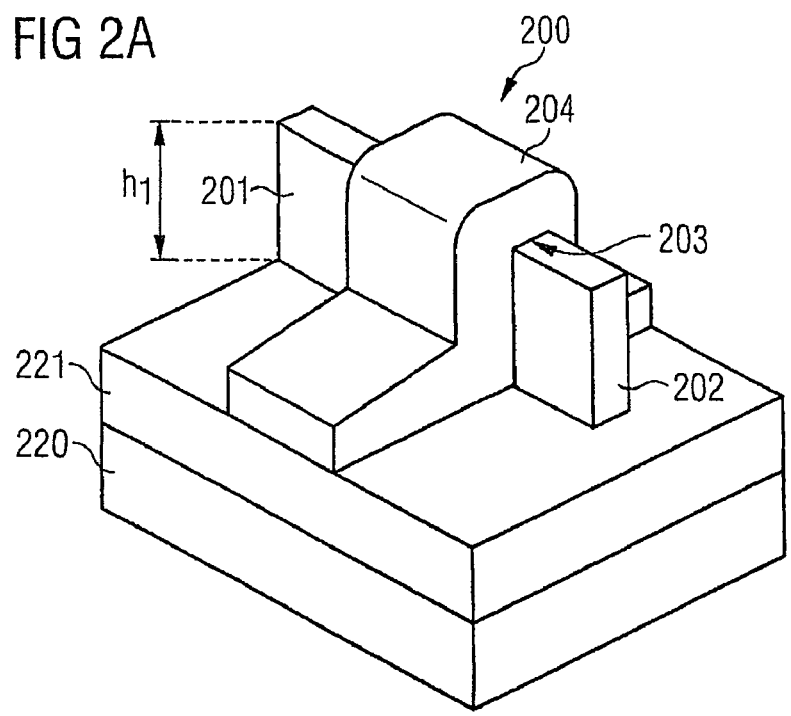
FIGS. 2A and 2B show perspective views of an n-MOS fin field effect transistor and a p-MOS fin field effect transistor in accordance with one exemplary embodiment of the invention.
Figure 2B:
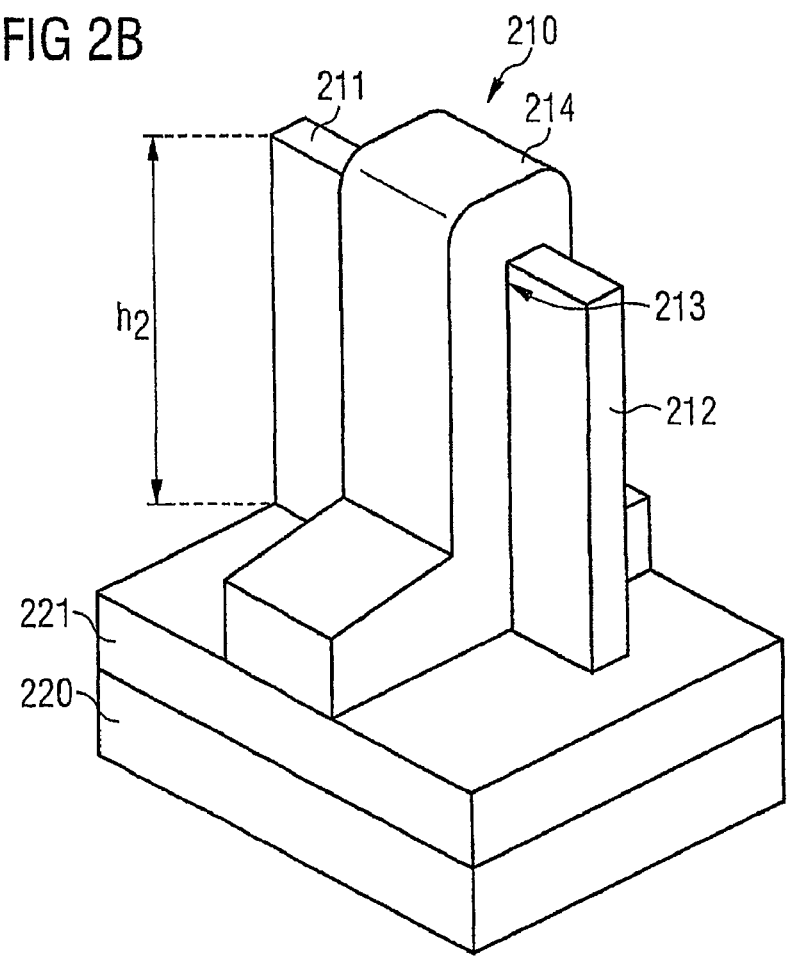

The fin field effect transistor arrangement from FIG. 2A, FIG. 2B, which contains the n-MOS fin field effect transistor 200 and the p-MOS fin field effect transistor 210, has a silicon substrate 220, on which a silicon oxide layer 221 is formed. Although transistors 200, 210 are illustrated separately in FIG. 2A, FIG. 2B, both fin field effect transistors 200, 210 are monolithically integrated in the same substrate 220.

The n-MOS fin field effect transistor 200 contains a silicon fin having the height $h_1$. A first source/drain region 201 and a second source/drain region 202 are formed in the silicon fin of the n-MOS fin field effect transistor 200. A channel region 203 is formed between the first source/drain region 201 and the second source/drain region 202, and the electrical conductivity of the channel region can be controlled by means of a gate region 204 formed above the silicon fin. A gate insulating layer (not shown) is arranged between the gate region 204 and the silicon fin.

The p-MOS fin field effect transistor 210 shown in FIG. 2B contains a silicon fin having the height $h_2$. A first source/drain region 211 and a second source/drain region 212 are formed in the silicon fin of the p-MOS fin field effect transistor 210 as implanted regions of the fin, a channel region 213 being arranged between the source/drain regions 211, 212. The electrical conductivity of the channel region 213 can be controlled by means of applying an electrical signal to a gate region 214, which is electrically insulated from the channel region by means of a gate insulating layer (not shown).

Figure 1B:
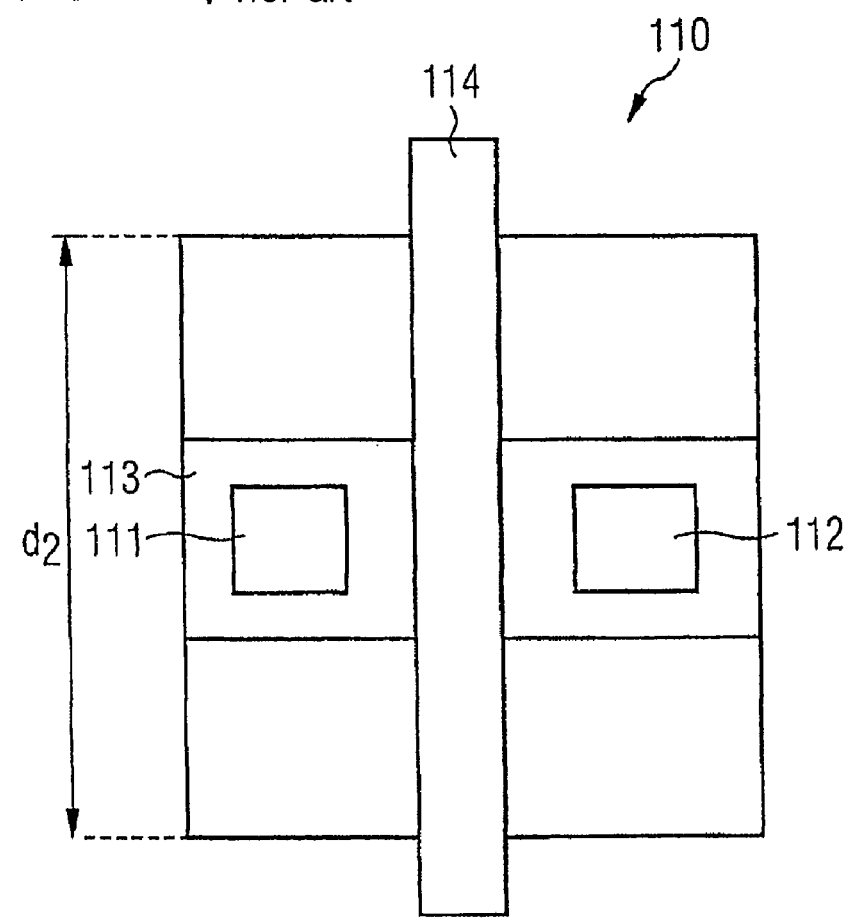
Figure 1C:
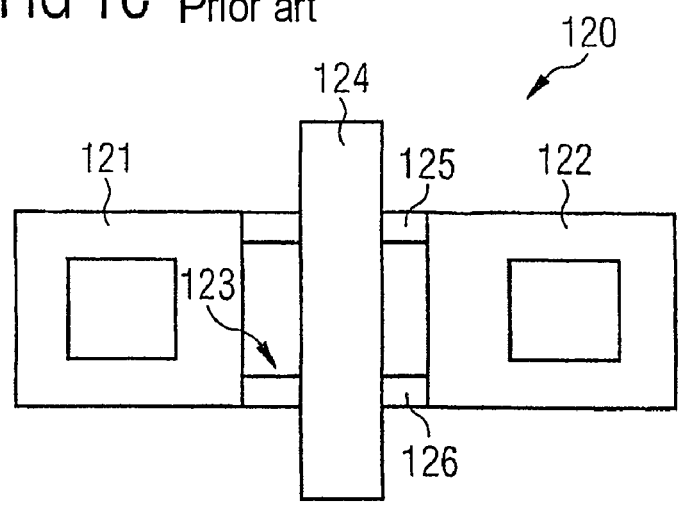
FIGS. 1C and 1D show plan views of an n-MOS fin field effect transistor and a p-MOS fin field effect transistor, in each case having a plurality of partial fins, in accordance with the prior art.
Figure 1D:
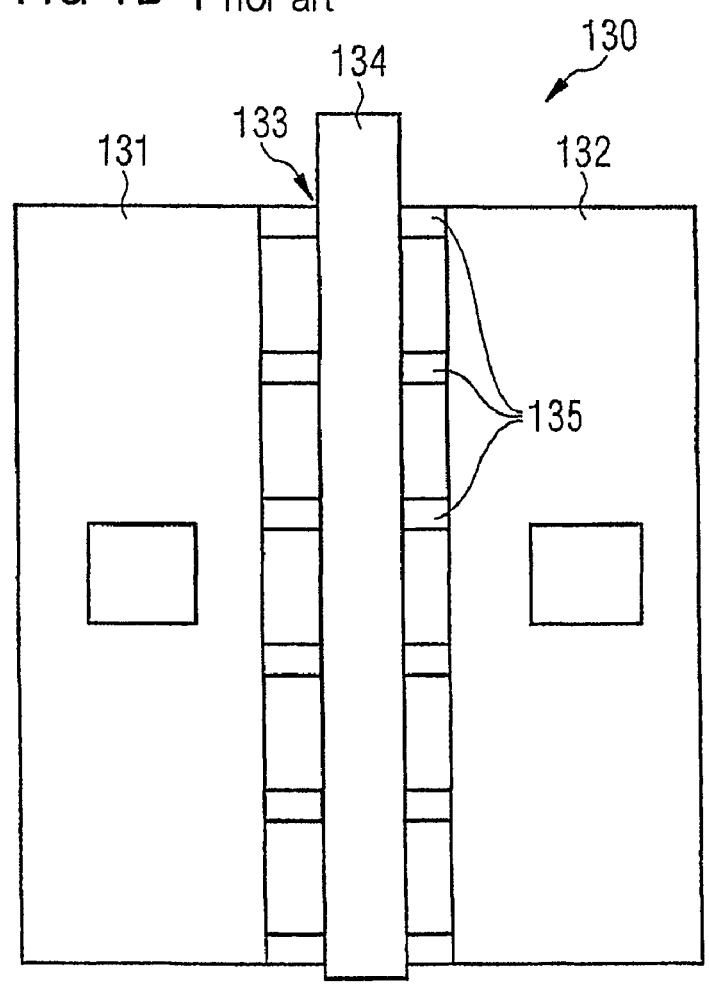

By virtue of the height of the silicon fin of the n-MOS fin field effect transistor 200 being provided such that it is smaller than in the case of the p-MOS fin field effect transistor 210 ($h_1 < h_2$), the current driver capabilities of the transistors 200, 210 are identical. In contrast to the conventional arrangements in FIG. 1A, FIG. 1B or in FIG. 2A, FIG. 2B, the adaptation of the current driver capabilities of the transistors 200, 210 does not lead to an increase in the space requirement of the transistors 200, 210 on the silicon substrate 220 since different dimensions of the components (namely of the silicon fins) are required only in a dimension perpendicular to the substrate surface. An optimization of the required layout area is thus achieved in the case of the CMOS fin field effect transistor arrangement according to the invention from FIG. 2A, FIG. 2B.

A description is given below, referring to FIG. 3, of a fin field effect transistor arrangement 300 in accordance with one exemplary embodiment of the invention.

The fin field effect transistor arrangement 300 is integrated in a silicon substrate 301, on which a silicon oxide layer 302 is formed. A first silicon fin having a height $h_1$ is formed on a first surface region of the fin field effect transistor arrangement 300, namely in an n-MOS fin field effect transistor region 305, the height hi being smaller than the height $h_2$ of a second silicon fin 304 in a p-MOS fin field effect transistor region 306. The fin field effect transistor arrangement 300 is formed on and in an SOI substrate (silicon-on-insulator). The gate region, the gate insulating layer and the source/drain regions of the fin field effect transistors of the fin field effect transistor arrangement 300 are not shown in FIG. 3.

The fin field effect transistor arrangement 300 is formed by subjecting the SOI substrate to a lithography and etching method, so that a first laterally delimited layer sequence and a second laterally delimited layer sequence are formed from the upper silicon layer of the SOI substrate (that is to say the silicon layer that was arranged above the silicon oxide layer 302). The first laterally delimited layer sequence forms the second silicon fin 304. In order to achieve silicon fins 303, 304 having different heights ($h_1 < h_2$), in a subsequent method step the p-MOS fin field effect transistor region 306 is covered with photoresist material and thus protected against removal of silicon material from the second silicon fin 304. Afterward, the second laterally delimited layer sequence is subjected to an etching method, whereby the second laterally delimited layer sequence is etched back in such a way that the first silicon fin 303 is thereby formed with a smaller height $h_1$ than the silicon fin 304 (height $h_2$). To put it another way, a lower silicon height is achieved by means of etching back silicon.

A description is given below, referring to FIG. 4, of a fin field effect transistor arrangement 400 in accordance with another exemplary embodiment of the invention.

The fin field effect transistor arrangement 400 shown in FIG. 4 differs from the fin field effect transistor arrangement 300 shown in FIG. 3 by virtue of the fact that a silicon oxide structure 401 is additionally applied on the first silicon fin 303. The additional silicon oxide structure 401, which may alternatively also be produced from silicon nitride material, has the effect that the same topology (that is to say the same surface structure) as is achieved in the p-MOS fin field effect transistor region 306 is achieved in the p-MOS fin field effect transistor region 305. This brings about advantages during subsequent lithography and planarization steps.

A description is given below, referring to FIG. 5, of a fin field effect transistor arrangement 500 in accordance with yet another exemplary embodiment of the invention.

Figure 5:
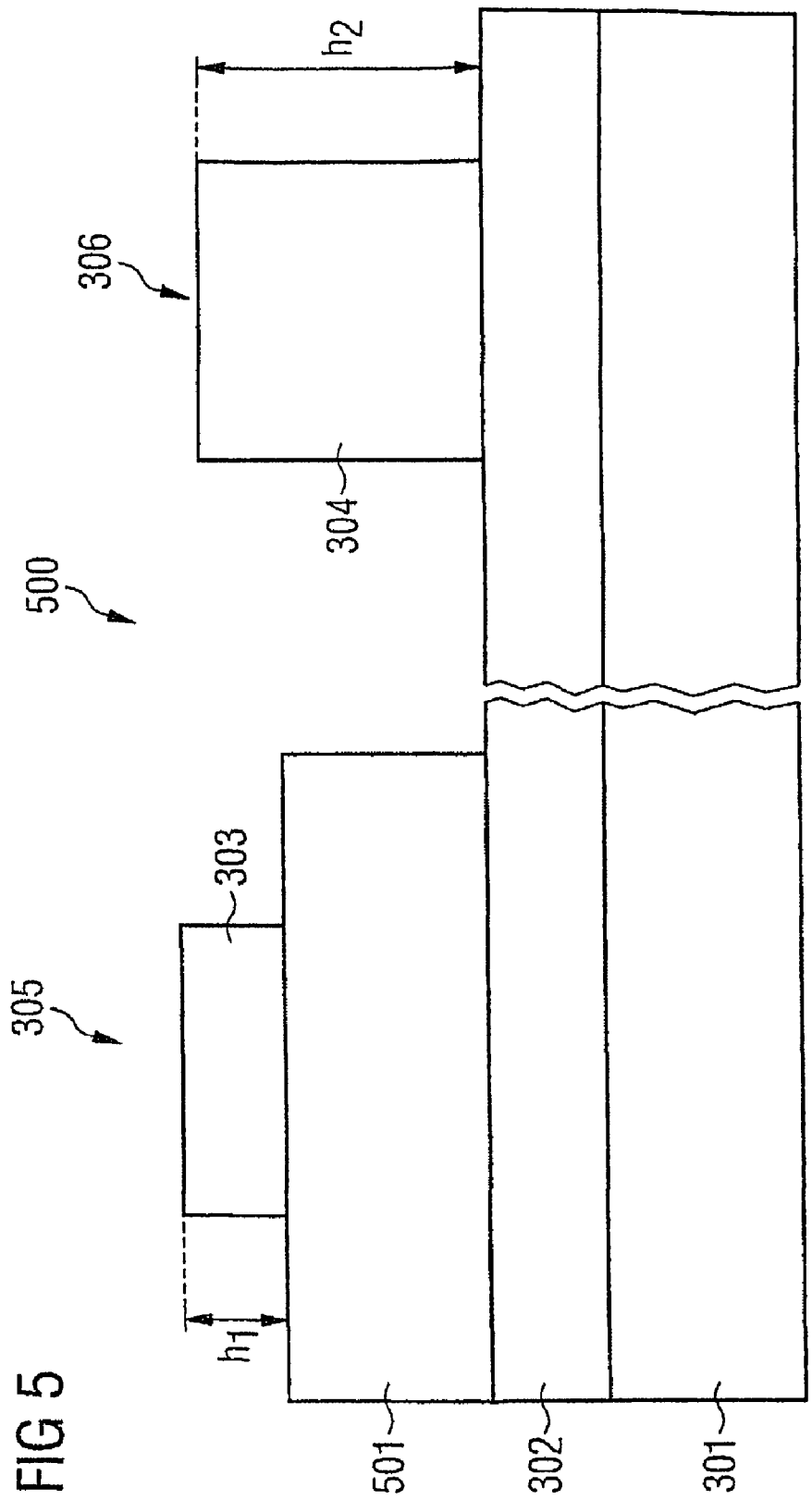
FIG. 5 shows a cross-sectional view of a fin field effect transistor arrangement in accordance with yet another exemplary embodiment of the invention.

The fin field effect transistor arrangement 500 shown in FIG. 5 differs from the fin field effect transistor arrangements 300, 400 shown in FIG. 3 and FIG. 4 by virtue of the fact that the fin field effect transistor arrangement 500 is formed proceeding from a substrate such as is described for example in FIG. 6 of the '310 publication, which describes a substrate having a carrier layer and an insulator layer having a stepped surface having different surface regions on the carrier layer, a semiconductor layer being formed on the stepped surface of the insulator layer, which semiconductor layer has a different semiconductor thickness in different surface regions, so that a substrate having a planar surface is formed as a result. The silicon substrate 301 serves as the carrier layer in the case of the fin field effect transistor arrangement 500. The stepped surface is formed by a silicon oxide structure being present in the n-MOS fin field effect transistor region 305, the silicon oxide structure being formed from the silicon oxide layer 302 and the additional silicon oxide layer 501 formed thereon. The additional silicon oxide layer 501 is not provided in the p-MOS fin field effect transistor region 306, so that the silicon oxide layer is formed solely by the silicon oxide layer 302 in this region. The substrate shown in FIG. 6 of the '310 publication contains a semiconductor layer that terminates with a planar surface. This semiconductor layer is still discernible in FIG. 5 only in the form of the first silicon fin 303 and the second silicon fin 304. Using a lithography and etching method, on the basis of FIG. 6 of the '310 publication, the semiconductor layer thickness that is different in different regions of the substrate is patterned in such a way that the first silicon fin 303 and the second silicon fin 304 are thereby formed, which have different heights $h_1 < h_2$, but the upper end sections of which are arranged at the same level.

Consequently, a fin field effect transistor arrangement 500 is provided in which the n-MOS fin field effect transistor and the p-MOS fin field effect transistor have substantially the same height.

What is claimed is:

1. A fin field effect transistor arrangement comprising:
   a substrate;
   a first fin field effect transistor on and/or in the substrate, the first fin field effect transistor having a fin in which a channel region is formed between a first source/drain region and a second source/drain region and above which a gate region is formed; and
   a second fin field effect transistor on and/or in the substrate, the second fin field effect transistor having a fin in which a channel region is formed between a first source/drain region and a second source/drain region and above which a gate region is formed, said second fin field effect transistor being arranged laterally alongside the first fin field effect transistor,
   wherein the first fin field effect transistor and the second fin field effect transistor are set up as a CMOS arrangement, which comprises an n-MOSFET and a p-MOSFET;
   wherein a height of the fin of the first fin field effect transistor is greater than a height of the fin of the second fin field effect transistor;
   wherein the n-MOSFET and the p-MOSFET have different driver current characteristics due to their respective dopings and wherein the different driver current characteristics are compensated for by the different heights of the fins of the n-MOSFET and the p-MOSFET; and
   wherein the fin of the first fin field effect transistor and/or the fin of the second fin field effect transistor is divided into a plurality of semiconductor partial fins formed laterally alongside one another.

2. The fin field effect transistor arrangement as claimed in claim 1, wherein the fin of the first fin field effect transistor has doping material of a p conduction type and the fin of the second fin field effect transistor either has doping material of an n conduction type or is substantially free of doping material.

3. The fin field effect transistor arrangement as claimed in claim 1, wherein the fin of the first fin field effect transistor has doping material of a p conduction type or is substantially free of doping material, and the fin of the second fin field effect transistor has doping material of an n conduction type.

4. The fin field effect transistor arrangement as claimed in claim 1, wherein the height of the fin of the first fin field effect transistor and the height of the fin of the second fin field effect transistor are selected in such a way that a current driver capability of the first fin field effect transistor is substantially equal to a current driver capability of the second fin field effect transistor.

5. The fin field effect transistor arrangement as claimed in claim 1, wherein the substrate comprises a silicon-on-insulator substrate.

6. The fin field effect transistor arrangement as claimed in claim 5, wherein the fin of the first fin field effect transistor and/or the fin of the second fin field effect transistor is at least partly formed from an upper silicon layer of the silicon-on-insulator substrate.

7. The fin field effect transistor arrangement as claimed in claim 1, wherein the height of the fin of the first fin field effect transistor and the height of the fin of the second fin field effect transistor and the number of partial fins of the first fin field effect transistor and the number of partial fins of the second fin field effect transistor are selected in such a way that a current driver capability of the first fin field effect transistor is substantially equal to a current driver capability of the second fin field effect transistor.

8. A method for producing a fin field effect transistor arrangement, the method comprising:
   forming a first fin field effect transistor on and/or in a substrate, the first fin field effect transistor including a fin in which a channel region is formed between a first source/drain region and a second source/drain region and above which a gate region is formed; and
   forming a second fin field effect transistor arranged laterally alongside the first fin field effect transistor, the second fin field effect transistor being formed on and/or in the substrate and including a fin in which the channel region is formed between the first and the second source/drain region and above which the gate region is formed,
   wherein the first fin field effect transistor and the second fin field effect transistor are set up as a CMOS arrangement, which comprises an n-MOSFET and a p-MOSFET; and
   wherein a height of the fin of the first fin field effect transistor is provided such that it is greater than a height of the fin of the second fin field effect transistor;
   wherein the n-MOSFET and the p-MOSFET have different driver current characteristics due to their respective dopings and wherein the different driver current characteristics are compensated for by the different heights of the fins of the n-MOSFET and the p-MOSFET; and
   wherein the fin of the first fin field effect transistor and/or the fin of the second fin field effect transistor is divided into a plurality of semiconductor partial fins formed laterally alongside one another.

9. The method as claimed in claim 8, wherein forming the second fin field effect transistor comprises forming an electrically insulating layer between the substrate and the fin of the second fin field effect transistor.

10. The method as claimed in claim 9, further comprising forming an electrically insulating layer over the fin of the second fin field effect transistor.

11. The method as claimed in claim 9, wherein a thickness of the electrically insulating layer is selected such that the electrically insulating layer together with the fin of the second fin field effect transistor has a height that is substantially equal to the height of the fin of the first fin field effect transistor.

12. The method as claimed in claim 8, wherein the fin of the first fin field effect transistor and the fin of the second fin field effect transistor are formed by:
   patterning a common semiconductor layer on the substrate, whereby a first laterally delimited layer forming the fin of the first fin field effect transistor is formed and a second laterally delimited layer is formed; and
   removing material of the second laterally delimited layer to form the fin of the second fin field effect transistor.

13. The method as claimed in claim 8, wherein the fin of the first fin field effect transistor and the fin of the second fin field effect transistor are formed from a surface semiconductor layer of a planar substrate, the surface semiconductor layer having a larger thickness in a region of the first fin field effect transistor than in a region of the second fin field effect transistor.

14. The method as claimed in claim 8, wherein the substrate comprises a silicon-on-insulator substrate.

15. The method as claimed in claim 14, wherein the fin of the first fin field effect transistor and/or the fin of the second fin field effect transistor is at least partly formed from an upper silicon layer of the silicon-on-insulator substrate.

16. The method as claimed in claim 8, further comprising introducing doping material into the fin of the first fin field effect transistor and/or into the fin of the second fin field effect transistor.

17. The method as claimed in claim 16, wherein introducing doping material comprises performing plasma immersion ion implantation, rapid vapor phase doping, or solid phase diffusion.

* * * * *